(12) United States Patent
Kim et al.

(10) Patent No.: US 12,315,703 B2
(45) Date of Patent: May 27, 2025

(54) PLASMA PROCESSING APPARATUS AND METHODS OF MANUFACTURING SEMICONDUCTOR DEVICE USING THE SAME

(71) Applicant: Samsung Electronics Co., Ltd., Suwon-si (KR)

(72) Inventors: Kyoungchon Kim, Goyang-si (KR); Taemin Earmme, Hwaseong-si (KR); Kwangnam Kim, Suwon-si (KR); Jongwoo Sun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 190 days.

(21) Appl. No.: 17/397,530

(22) Filed: Aug. 9, 2021

(65) Prior Publication Data

US 2022/0165550 A1 May 26, 2022

(30) Foreign Application Priority Data

Nov. 26, 2020 (KR) .................. 10-2020-0160829

(51) Int. Cl.
*H01J 37/32* (2006.01)
*H01L 21/3065* (2006.01)
*H01L 21/683* (2006.01)

(52) U.S. Cl.
CPC .. *H01J 37/32642* (2013.01); *H01J 37/32715* (2013.01); *H01J 37/32972* (2013.01); *H01L 21/3065* (2013.01); *H01L 21/6833* (2013.01); *H01J 2237/24578* (2013.01); *H01J 2237/334* (2013.01)

(58) Field of Classification Search
CPC ........... H01J 37/32642; H01J 37/32715; H01J 37/32972; H01J 2237/24578; H01J 2237/334; H01L 21/3065; H01L 21/6833
USPC ...................................... 156/345.51
See application file for complete search history.

(56) References Cited

U.S. PATENT DOCUMENTS

| | | |
|---|---|---|
| 8,730,482 B2 | 5/2014 | Matsudo et al. |
| 10,014,198 B2 | 7/2018 | Richardson |
| 10,186,402 B2 | 1/2019 | Kamata et al. |
| 2002/0072240 A1 | 6/2002 | Koike |

(Continued)

FOREIGN PATENT DOCUMENTS

| | | |
|---|---|---|
| KR | 1020100009916 A | 1/2010 |
| KR | 10-2016-0093021 A | 8/2016 |
| KR | 1020190040912 A | 4/2019 |

*Primary Examiner* — Charlee J. C. Bennett
(74) *Attorney, Agent, or Firm* — Muir Patent Law, PLLC

(57) ABSTRACT

A plasma processing apparatus includes a substrate chuck having a first region configured to support a substrate and a second region located at a lower level, a focus ring disposed on the second region and surrounding an outer circumferential surface of the first region, a driving unit disposed below the focus ring, the driving unit including a driving source and a driving shaft in contact with a lower surface of the focus ring and configured to adjust a position of an upper surface of the focus ring by a first distance value, a chromatic confocal sensor disposed below the focus ring and configured to measure a second distance value in which the lower surface of the focus ring is moved by irradiating measurement light to the lower surface of the focus ring, and a control unit calculating an error value between the first distance value and the second distance value.

10 Claims, 10 Drawing Sheets

(56) References Cited

U.S. PATENT DOCUMENTS

| | | | |
|---|---|---|---|
| 2004/0184028 A1* | 9/2004 | Fink | H01J 37/32862 356/72 |
| 2010/0025369 A1 | 2/2010 | Negishi et al. | |
| 2010/0206482 A1* | 8/2010 | Matsudo | G01J 5/0003 118/712 |
| 2011/0235056 A1* | 9/2011 | Matsudo | G01B 9/0209 356/630 |
| 2018/0061696 A1 | 3/2018 | D'Ambra et al. | |
| 2018/0261481 A1 | 9/2018 | Eto | |
| 2018/0277416 A1 | 9/2018 | Takahashi et al. | |
| 2019/0108986 A1* | 4/2019 | Saitoh | H01J 37/32724 |
| 2020/0098550 A1* | 3/2020 | Takahashi | H01L 21/68735 |
| 2020/0303235 A1* | 9/2020 | Miyadate | H01L 21/67742 |
| 2020/0411390 A1* | 12/2020 | Yang | H01L 21/67253 |
| 2021/0098238 A1* | 4/2021 | Hayashi | H01L 21/68735 |
| 2021/0156667 A1* | 5/2021 | Sesko | G01B 11/0608 |

\* cited by examiner

PLASMA PROCESSING APPARATUS AND METHODS OF MANUFACTURING SEMICONDUCTOR DEVICE USING THE SAME

CROSS-REFERENCE TO RELATED APPLICATION(S)

This application claims benefit of priority to Korean Patent Application No. 10-2020-0160829 filed on Nov. 26, 2020 in the Korean Intellectual Property Office, the disclosure of which is incorporated herein by reference in its entirety.

BACKGROUND

1. Field

Examples of the present inventive concept relate to a plasma processing apparatus and a method for manufacturing a semiconductor device.

2. Description of Related Art

In general, a semiconductor device is manufactured through a plurality of unit processes including a thin film deposition process, and an etching process or a cleaning process. Among the etching process, a dry etching process is performed in a semiconductor manufacturing device in which a plasma reaction is mainly induced. With the miniaturization and high integration of semiconductor products, the influence of a nonuniform dry etching process on characteristics of a semiconductor device is increasing.

SUMMARY

An aspect of the present inventive concept is to provide a plasma processing apparatus capable of maintaining a constant surface level of a focus ring and a method of manufacturing a semiconductor device using the same.

According to an aspect of the present inventive concept, a plasma processing apparatus includes: a substrate chuck extending radially in a first direction, and including a first surface and a second surface opposing the first surface, the first surface having a first region configured to support a substrate and a second region located a level lower than the first region in a second direction perpendicular to the first direction, a focus ring disposed on the second region of the first surface of the substrate chuck and surrounding an outer circumferential surface of the first region of the substrate chuck, a driving unit disposed below the focus ring, the driving unit including a driving source and a driving shaft in contact with a lower surface of the focus ring and configured to adjust a position of an upper surface of the focus ring by raising or lowering the focus ring by a first distance value in the second direction, a chromatic confocal sensor disposed below the focus ring and configured to measure, a second distance value in which the lower surface of the focus ring is moved in the second direction, by irradiating measurement light to the lower surface of the focus ring, and a control unit calculating an error value between the first distance value and the second distance value and determining whether the error value is within a preset range.

According to an aspect of the present inventive concept, a plasma processing apparatus includes: a chamber having an internal space for processing a substrate by generating plasma, a substrate chuck extending radially in a first direction and disposed in the internal space, the substrate chuck including a first surface and a second surface opposing the first surface, the first surface having a first region configured to support the substrate and a second region located a level lower than the first region in a second direction perpendicular to the first direction, a focus ring surrounding an outer circumferential surface of the first region of the substrate chuck, the focus ring configured to be detachable from the substrate chuck, a driving unit disposed below the focus ring, the driving unit including a driving source and a driving shaft in contact with a lower surface of the focus ring and configured to adjust a position of an upper surface of the focus ring by raising or lowering the focus ring by a first distance value in the second direction, a chromatic confocal sensor disposed below the focus ring and configured to measure a distance value in which a lower surface of the focus ring is raised or lowered in the second direction by irradiating measurement light to the lower surface of the focus ring, and a control unit calculating an error value between a distance value measured by the chromatic confocal sensor and a distance value driven by the driving unit and determining whether the error value is within a preset value.

According to an aspect of the present inventive concept, a method of manufacturing a semiconductor device, the method comprising: disposing a substrate on a substrate chuck extending radially in a first direction, and including a first surface and a second surface opposing the first surface, the first surface having a first region configured to support the substrate and a second region located a level lower than the first region in a second direction perpendicular to the first direction and configured to support a focus ring driving a driving unit, disposed below the focus ring, the driving unit including a driving source and a driving shaft in contact with a lower surface of the focus ring and configured to raise and lower the focus ring by a first distance value in the second direction, irradiating, from a chromatic confocal sensor disposed below the focus ring, a measurement light to the lower surface of the focus ring to measure a second distance value in which the lower surface of the focus ring is raised or lowered, and calculating an error value between the first distance value and the second distance value and determining whether the error value is within a preset range.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, the example embodiments of the present disclosure will be described in detail with reference to the attached drawings.

Figure 1:
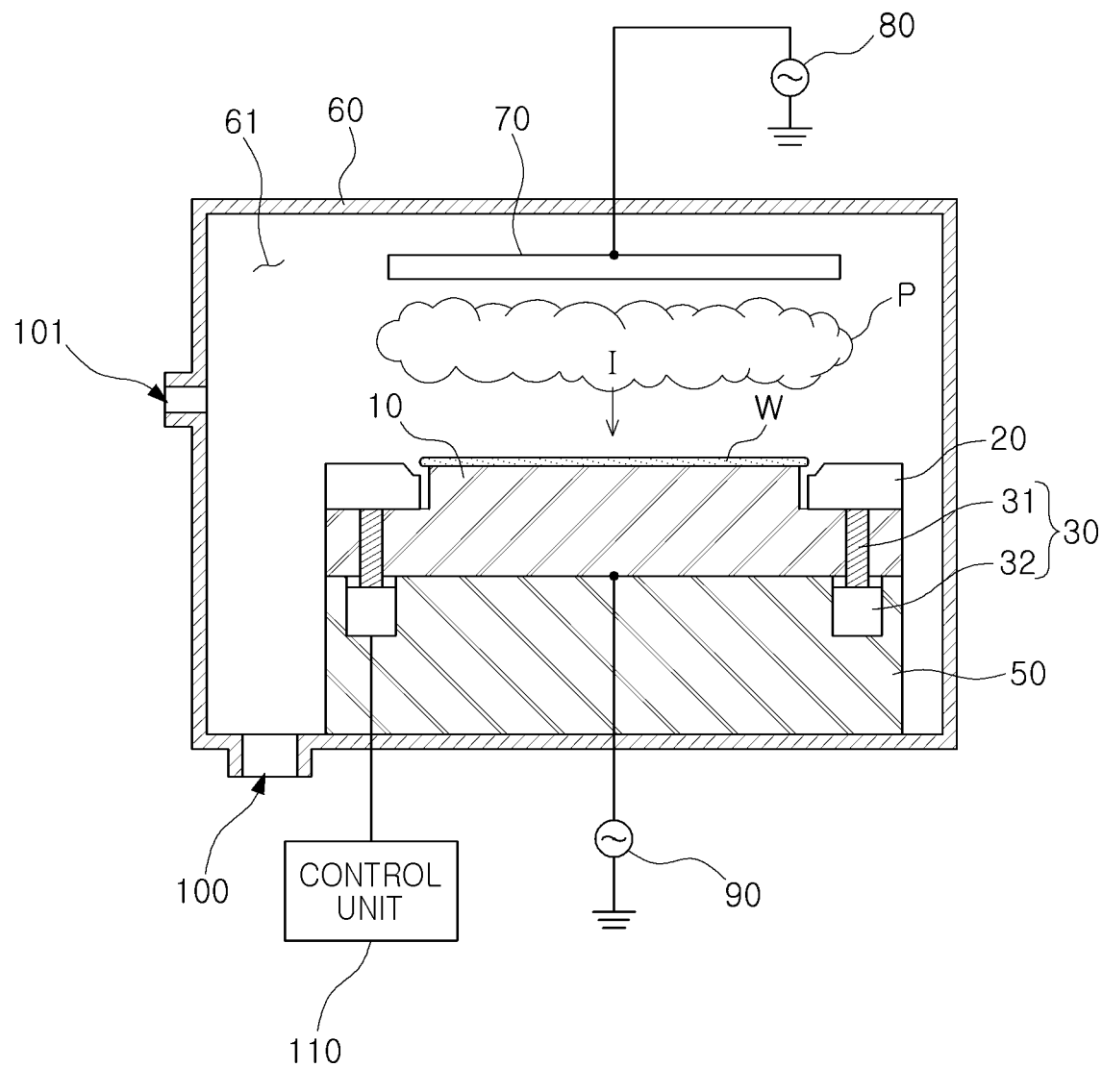
FIG. 1 is a view schematically illustrating a plasma processing apparatus according to an example embodiment of the present inventive concept.
Figure 2:
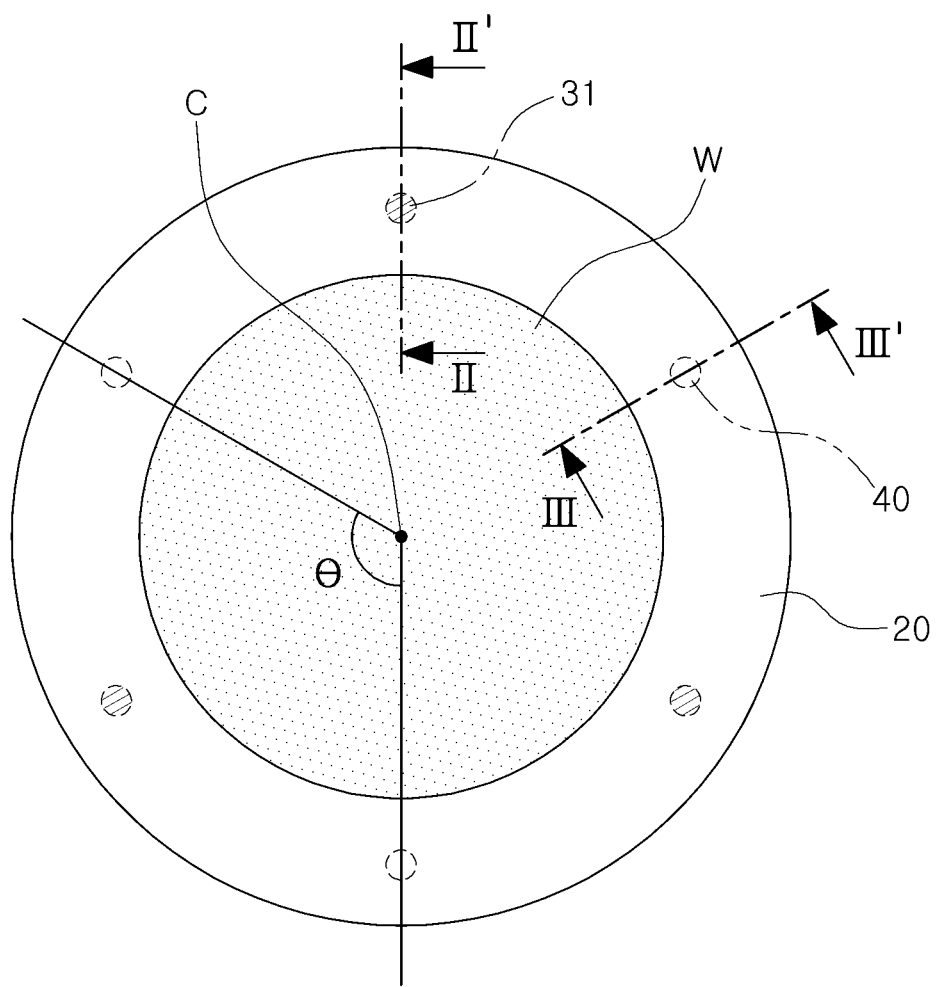
FIG. 2 is a plan view viewed from a direction of I of FIG. 1.
Figure 3:
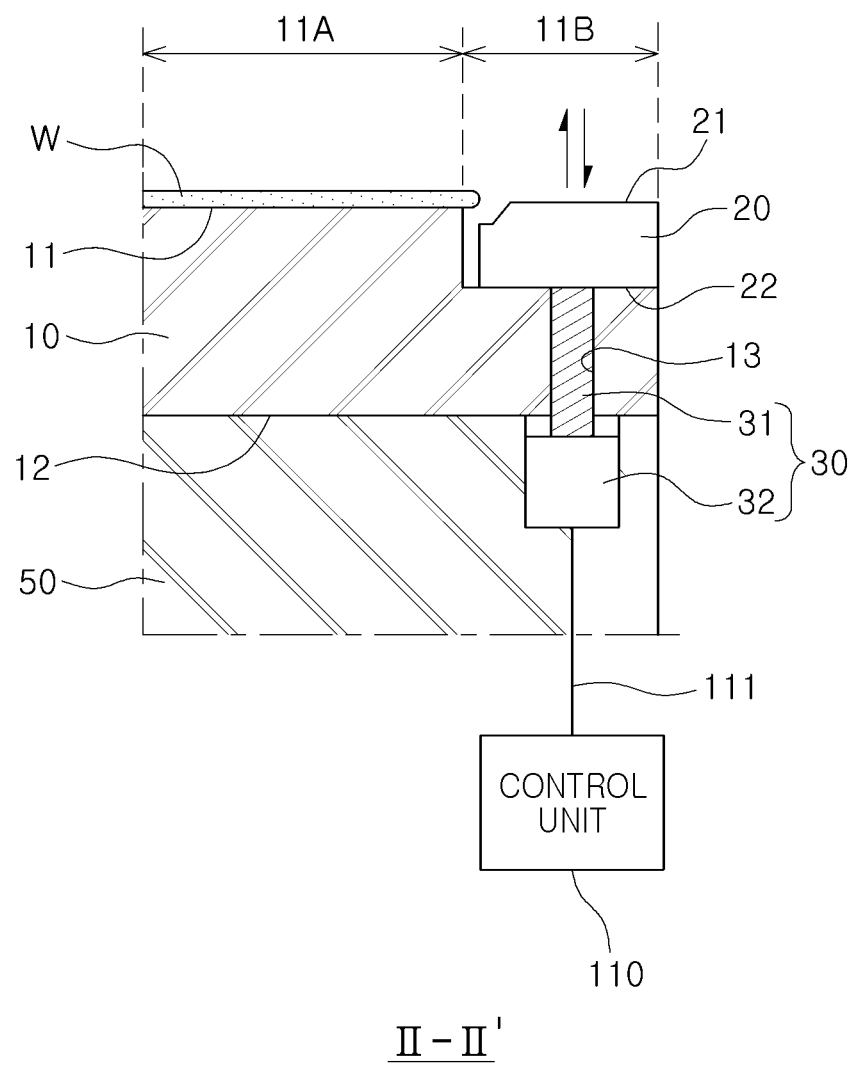
FIG. 3 is a side cross-sectional view taken along line II-II' of FIG. 2.
Figure 4:
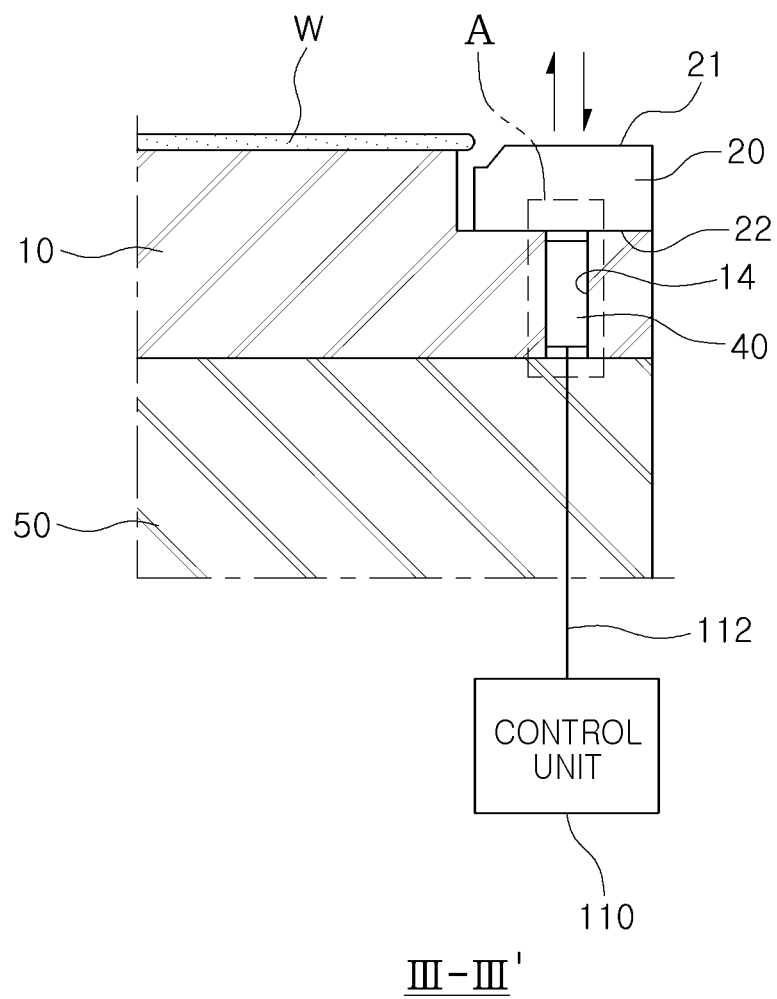
FIG. 4 is a side cross-sectional view taken along line of III-III' FIG. 2.

A plasma processing apparatus according to an example embodiment of the present inventive concept will be described with reference to FIGS. 1 to 4. FIG. 1 is a view schematically illustrating a plasma processing apparatus according to an example embodiment of the present inventive concept, and FIG. 2 is a plan view viewed from a direction of I (i.e., first direction) of FIG. 1. FIG. 3 is a side cross-sectional view taken along line of FIG. 2, and FIG. 4 is a side cross-sectional view taken along line III-III' of FIG. 2.

Referring to FIGS. 1 and 2, a plasma processing apparatus 1 according to an example embodiment of the present inventive concept may include: a process chamber 60, a lower electrode 10 disposed in the process chamber 60 and supporting a substrate W, a focus ring 20 disposed at an edge of the lower electrode 10, a driving unit 30 disposed below the focus ring 20, and a chromatic confocal sensor 40. In addition, the plasma processing apparatus 1 may include an isolator 50 disposed below the lower electrode 10, and an upper electrode 70 disposed to face the lower electrode 10. The plasma processing apparatus 1 may be controlled by a control unit 110. Spatially relative terms, such as "beneath," "below," "lower," "above," "upper" and the like, may be used herein for ease of description to describe positional relationships, such as illustrated in the figures, e.g. It will be understood that the spatially relative terms encompass different orientations of the device in addition to the orientation depicted in the figures.

The process chamber 60 may provide an internal space 61 that is performed in a processing process for the substrate W. For example, the process chamber 60 may provide a space for performing a dry etching process in an internal space 61. The process chamber 60 may include an inlet 101 and an outlet 100 that can be selectively opened and closed depending on controlling of the control unit 110. Source gas used in a plasma processing process may be supplied to the internal space 61 through the inlet 101. By-products generated by the plasma treatment process may be discharged through the outlet 100. In FIG. 1, it is illustrated that one inlet 101 and one outlet 100 are formed in the process chamber 60, respectively, but the present inventive concept is not limited thereto. The process chamber 60 may also include a plurality of inlets 101 and a plurality of outlets 100.

The lower electrode 10 may support an object to be processed, that is, the substrate W. The substrate W may be a circular wafer radially extending in a second direction, perpendicular to the first direction. For example, the lower electrode 10 is a substrate chuck that fixes the substrate W, and may be an electrostatic chuck. That is, the substrate W may be seated on the lower electrode 10 by electrostatic force formed above the lower electrode 10.

Referring to FIGS. 2 and 3, the lower electrode 10 may have a shape, similar to that of the substrate W, and for example, an upper surface 11 of the lower electrode 10 may be formed in a circular shape. The lower electrode 10 may include an upper surface 11 facing the substrate W and a lower surface 12 facing and in contact with the isolator 50. The upper surface 11 of the lower electrode 10 may include a first region 11A on which the substrate W is seated and a second region 11B surrounding the first region 11A and having a level in the first direction, lower than that of the first region 11A, the second region 11B being a region having a step.

The substrate W may completely cover the first region 11A of the lower electrode 10, and a portion of the substrate W may protrude toward the second region 11B of the lower electrode 10 beyond the edge of the first region 11A of the lower electrode 10. That is, a width of the first region 11A of the lower electrode 10 may be smaller than a width of the substrate W. This is to prevent damage to the lower electrode 10 in a plasma processing process for the substrate W. For example, during a dry etching process an upper surface of the substrate W is exposed to plasma. However, because the width of the substrate W is greater than the width of the first region 11A of the lower electrode 10, the upper surface 11 of the lower electrode 10 may not be exposed to plasma.

The focus ring 20 may be disposed to surround the edge of the substrate W. The focus ring 20 may be disposed in the second region 11B of the lower electrode 10 to surround the substrate W. That is, the focus ring 20 may have a ring shape surrounding the first region 11A in which the substrate W is disposed. In the illustrated example embodiments, when viewed from above the lower electrode 10, the focus ring 20 and the substrate W do not overlap. However, example embodiments are not limited thereto. In some example embodiments, a portion of the focus ring 20 may be disposed below the edge of the substrate W to have a region overlapping the substrate W in the first direction. The focus ring 20 may prevent the lower electrode 10 from being damaged during the plasma processing process, and may maintain a uniform flow of etching gas during an etching process, thereby making an etching profile of the substrate W uniform. The focus ring 20 may be manufactured separately from the lower electrode 10 so as to be detachable from the lower electrode 10. Accordingly, the focus ring 20 can be raised or lowered by the driving unit 30.

When the focus ring 20 includes, for example, a conductive material, it may have a property of a conductor through which current flows. When an electric field is formed by applying RF power to the lower electrode 10 and/or the upper electrode 70, the focus ring 20 may function to expand a region in which the electric field is formed so that the substrate W is uniformly processed as a whole. In addition, the focus ring 20 may function to limit a region in which the plasma P is formed within a specific region.

The focus ring 20 may be made of or include, for example, a semiconductor material such as silicon (Si), silicon carbide (SiC), and gallium arsenide (GaAs). Since the focus ring 20 is directly exposed to the plasma P during the plasma processing process, the upper surface 21 of the focus ring 20 may be etched as the plasma processing process is repeated. As the plasma processing process is repeated, a level of the upper surface 21 of the focus ring 20 may gradually decrease. Therefore, in order to make the etching profile of the substrate W uniform, even if the plasma processing process is repeated, it is necessary to maintain a uniform level of the upper surface 21 of the focus ring 20.

In an example embodiment, by disposing below the focus ring 20 a driving unit 30 capable of raising or lowering the focus ring 20, even if the upper surface 21 of the focus ring 20 is etched, the focus ring 20 may be raised or lowered, so that the level of the upper surface 21 thereof may be maintained to be uniform. However, due to a limitation of the driving unit 30 or a slip of the focus ring 20, a distance by which a driving shaft 31 of the driving unit 30 is moved and a distance by which the focus ring 20 is actually moved may not coincide. In an example embodiment, by disposing below the focus ring 20 a chromatic confocal sensor 40 for measuring the distance actually moved by the focus ring 20, and comparing the distance measured by the chromatic confocal sensor 40 with the distance moved by the driving shaft 31, the level of the upper surface 21 of the focus ring 20 can be maintained to be uniform.

The driving unit 30 may be disposed below the focus ring 20 to raise and lower the focus ring 20 in the first direction. The driving unit 30 may include a driving shaft 31 for moving the focus ring 20 up and down in the first direction while in contact with the focus ring 20, and a driving source 32 for driving the driving shaft 31. The driving unit 30 may be connected to a control unit 110 through a cable 111, and may be controlled by the control unit 110. It will be understood that when an element is referred to as being "directly connected" or "directly coupled" to another element, or as "contacting" or "in contact with" another element, there are no intervening elements present at the point of contact.

The driving shaft 31 may be disposed in a through-hole 13 formed to penetrate through the lower electrode 10. One end portion of the driving shaft 31 may be disposed to be in contact with the focus ring 20, and the other end portion thereof may be connected to a driving source 32 to transmit a movement of the driving source 32 to the focus ring 20. The driving shaft 31 may employ various types of members capable of transmitting the movement of the driving source 32. In an example embodiment, the driving shaft 31 may be a lift pin. The driving source 32 may be directly fastened to the driving shaft 31, and according to a control of the control unit 110, the driving source 32 may raise or lower the driving shaft 31 in the first direction by a corresponding distance value (hereinafter, referred to as a "first distance value"). Various types of motors may be employed as the driving source 32. At least three driving shafts 31 may be disposed below and in contact with the focus ring 20. When the three driving shafts 31 are disposed, each of the driving shafts 31 may have an equal angle of 120° therebetween with each other.

Referring to FIGS. 2 and 4, at least one chromatic confocal sensor 40 may be disposed below the focus ring 20. The chromatic confocal sensor 40 may be disposed in a through-hole 14 formed to penetrate through the lower electrode 10. When a plurality of chromatic confocal sensors 40 are disposed, each chromatic confocal sensor 40 may be disposed along the focus ring 20 on the outer circumferential surface of the substrate W at regular intervals. That is, the plurality of chromatic confocal sensors 40 may be disposed to have the same angle Θ therebetween with respect to a center C of the substrate W when viewed from above the lower electrode 10. For example, when two chromatic confocal sensors 40 are disposed, each chromatic confocal sensor 40 may have an equal angle Θ of 180° therebetween with each other, and when three chromatic confocal sensors 40 are disposed, each of the chromatic confocal sensors 40 may have an equal angle Θ of 120° therebetween with each other.

Figure 5:
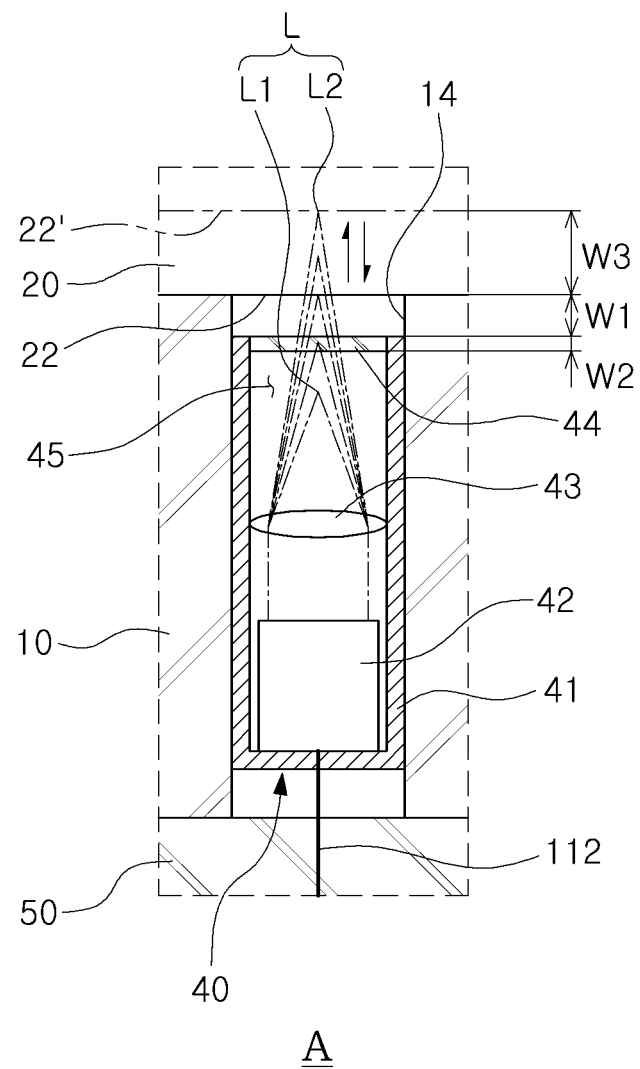
FIG. 5 is an enlarged view of part A of FIG. 4.

Referring to FIGS. 4 and 5, the chromatic confocal sensor 40 may be disposed below the focus ring 20, so that measurement light L may be irradiated to the lower surface 22 of the focus ring 20 and a distance between the lower surface 22 of the focus ring 20 and the chromatic confocal sensor 40 may be measured. It is sufficient if the chromatic confocal sensor 40 is disposed below the focus ring 20, and the chromatic confocal sensor 40 does not necessarily need to be disposed on the lower electrode 10. That is, when an additional member is disposed around the lower electrode 10, the chromatic confocal sensor 40 may be disposed in an additional member disposed around the lower electrode 10 within a limit of being disposed below the focus ring 20.

The chromatic confocal sensor 40 may be connected to a control unit 110 through an optical cable 112. The chromatic confocal sensor 40 may be disposed at the same level in the first direction as the upper surface 11 of the lower electrode 10, but is not limited thereto, and the chromatic confocal sensor 40 may be disposed at a level as low as a predetermined interval W1 measured in advance. The predetermined interval may be 1 mm to 3.5 mm. Although the chromatic confocal sensor 40 may be disposed at the same level in the first direction as the upper surface 11 of the lower electrode 10, during the high-temperature plasma processing process, the chromatic confocal sensor 40 may protrude on the upper surface 11 of the lower electrode 10. When the chromatic confocal sensor 40 is disposed at a level as low as the predetermined interval W1, the chromatic confocal sensor 40 may be prevented from being damaged by the focus ring 20 disposed above.

The chromatic confocal sensor 40 may irradiate monochromatic lights L1 and L2 having different wavelength bands to the lower surface 12 of the focus ring 20 as a measurement object, and measure a distance from the lower surface 22 of the focus ring 20. Monochromatic lights L1 and L2 included in the measurement light L irradiated by the chromatic confocal sensor 40 have different focal lengths, respectively, due to chromatic aberration.

Since the measurement light L emitted from the chromatic confocal sensor 40 is reflected from the lower surface 12 of the focus ring 20, so a peak spectrum of the corresponding monochromatic light is detected, thereby, a distance W3 between the chromatic confocal sensor 40 and the lower surface 12 of the focus ring 20 may be measured. Therefore, a distance to a measurement object may be accurately measured by detecting monochromatic light accurately focused on the measurement object. The chromatic confocal sensor 40 may transmit the distance value measured through the optical cable 112 to a control unit 110, and the control unit 110 may compare the transmitted distance value (hereinafter, referred to as a 'second distance value') and the first distance value. The control unit 110 may compare the first distance value and the second distance value, calculate an error value, and determine whether the error value is within a preset allowable range.

Referring to FIG. 5, the chromatic confocal sensor 40 may include a body portion 41, a light source portion 42, an optical module portion 43, and a light transmitting cover portion 44.

The body portion 41 may have an internal space 45, and a light source portion 42 and an optical module portion 43 may be disposed in the internal space 45. The body portion 41 may be made of a material such as aluminum alloy, ceramic ($Al_2O_3$, AlN, SiC, or the like), and quartz.

The light source portion 42 is a light source emitting white light and may be disposed in the internal space of the body portion 41. The light source portion 42 may be a light generating device capable of generating light by itself, but is not limited thereto. For example, the light source portion 42 may be a light transmitting device capable of transmitting light transmitted through the optical cable 112.

The optical module portion 43 may be disposed in front of the light source portion 42 to disperse the white light emitted from the light source portion 42 into a plurality of monochromatic lights L1 and L2 having different chromatic aberrations and emit it forward. Monochromatic lights L1 and L2 emitted from the optical module portion 43 may be defined as measurement light L. The optical module portion 43 may comprise, for example, a prism or a diffraction grating.

A light transmitting cover portion 44 may be disposed in front of the optical module portion 43, and may seal the body portion 41. The light transmitting cover portion 44 may seal the body portion 41 to prevent the optical module portion 43 from being damaged by the plasma P in the process chamber 60. The light transmitting cover portion 44 may be formed in a plate shape having a predetermined thickness W2, and may be made of a light transmitting material through which the measurement light L is transmitted. For example, the light transmitting cover portion 44 may be made of a material including at least one of sapphire and quartz.

Since the measurement light L emitted from the optical module portion 43 is reflected at each interface of the light transmitting cover portion 44 in the process of passing through the translucent cover portion 44 and is detected as a peak spectrum, the control unit 110 may measure the thickness W2 of the translucent cover portion 44 from the peak spectrum. The light transmitting cover portion 44 is etched in the process of performing the processing process for the substrate W and becomes thinner. If the light transmitting cover portion 44 is not replaced at an appropriate time, the optical module portion 43 may be damaged. In an example embodiment, since the thickness W2 of the light transmitting cover portion 44 can be accurately measured, it is possible to accurately determine when the light transmitting cover portion 44 is to be replaced.

Since the chromatic confocal sensor 40 having such a configuration does not have an electronic device therein, it can be free from an influence of electromagnetic waves. Accordingly, compared to sensors that are affected by the plasma P because the electronic device is included therein, an accurate distance value can be measured even in the process chamber 60.

The control unit 110 controls an overall operation of the plasma processing apparatus 1, and may control the operation of the driving unit 30 and the chromatic confocal sensor 40. In addition, the control unit 110 may detect a peak spectrum of reflected light transmitted through the chromatic confocal sensor 40, and convert the peak spectrum into a distance value.

The control unit 110 may include a photodetector detecting a peak spectrum of reflected light transmitted through the chromatic confocal sensor 40 and converting the peak spectrum into a distance value. The control unit 110 may subtract the distance W1 between the upper surface of the chromatic confocal sensor 40 and the upper surface of the lower electrode 10 and the thickness W2 of the light transmitting cover portion 44 from the distance value converted by the optical detection portion, so that a distance value in which the lower surface 12 of the focus ring 20 is raised or lowered may be determined. For example, the control unit 110 may be implemented as a processor such as a central processing unit (CPU), a graphic processing unit (GPU), a microprocessor, an application specific integrated circuit (ASIC), and field programmable gate arrays (FPGA), and a memory for storing various types of data required for the operation of the plasma processing apparatus 1 may be provided. In addition, the control unit 110 may store a measurement value measured by the chromatic confocal sensor 40 in a memory.

An isolator 50 may be disposed below the lower electrode 10. The isolator 50 may support the lower electrode 10. The isolator 50 may include or may be formed of an insulating material, for example, ceramic.

An upper electrode 70 may be disposed in the process chamber 60 to face the lower electrode 10.

During the plasma processing process by the plasma processing apparatus according to the example embodiment of the present inventive concept, RF power may be applied to the lower electrode 10 by a second power supply 90. The upper electrode 70 may receive RF power from the first power supply 80, and may excite source gas supplied into the process chamber 60 in synchronization with the lower electrode 10 as plasma P.

Figure 6:
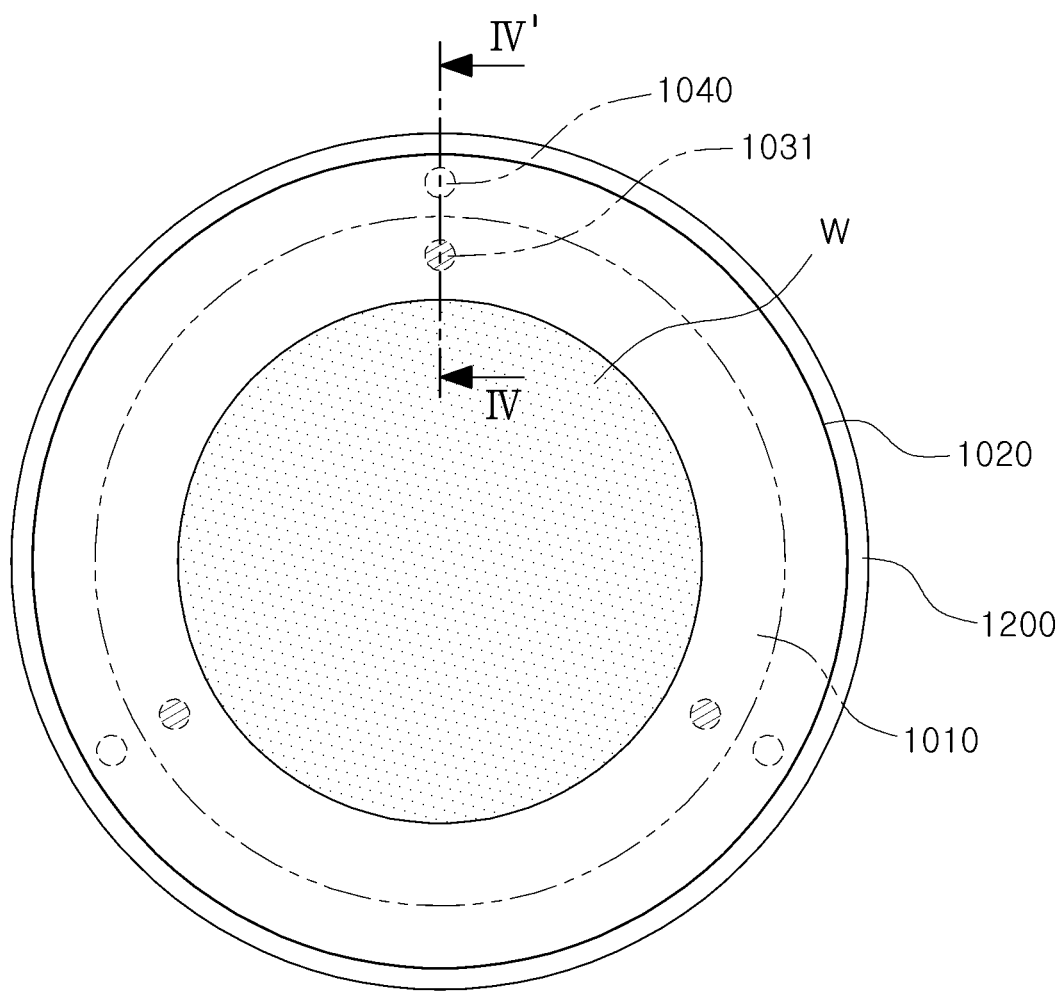
FIGS. 6 and 9 are diagrams illustrating a plasma processing apparatus according to example embodiments of the present inventive concept.
Figure 7:
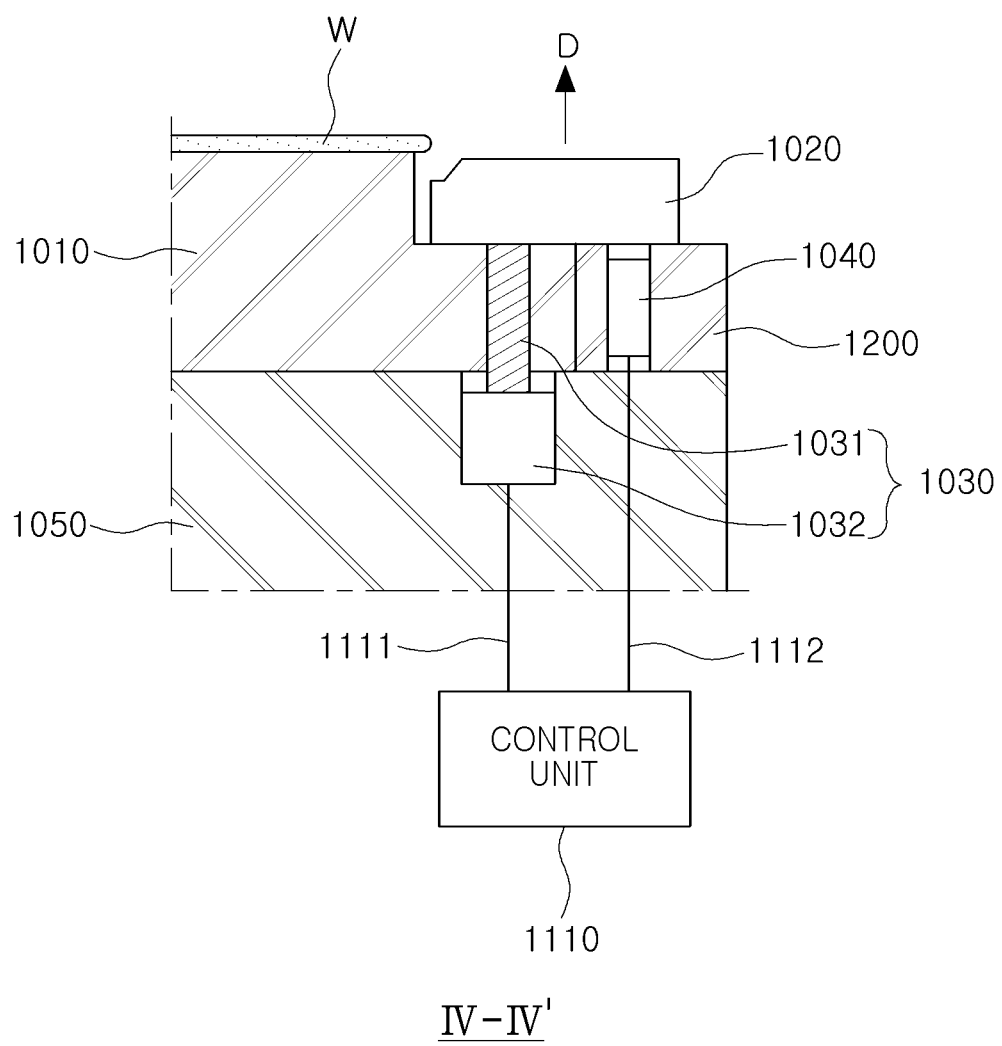
FIG. 7 is a side cross-sectional view taken along line IV-IV' of FIG. 6.
Figure 8:
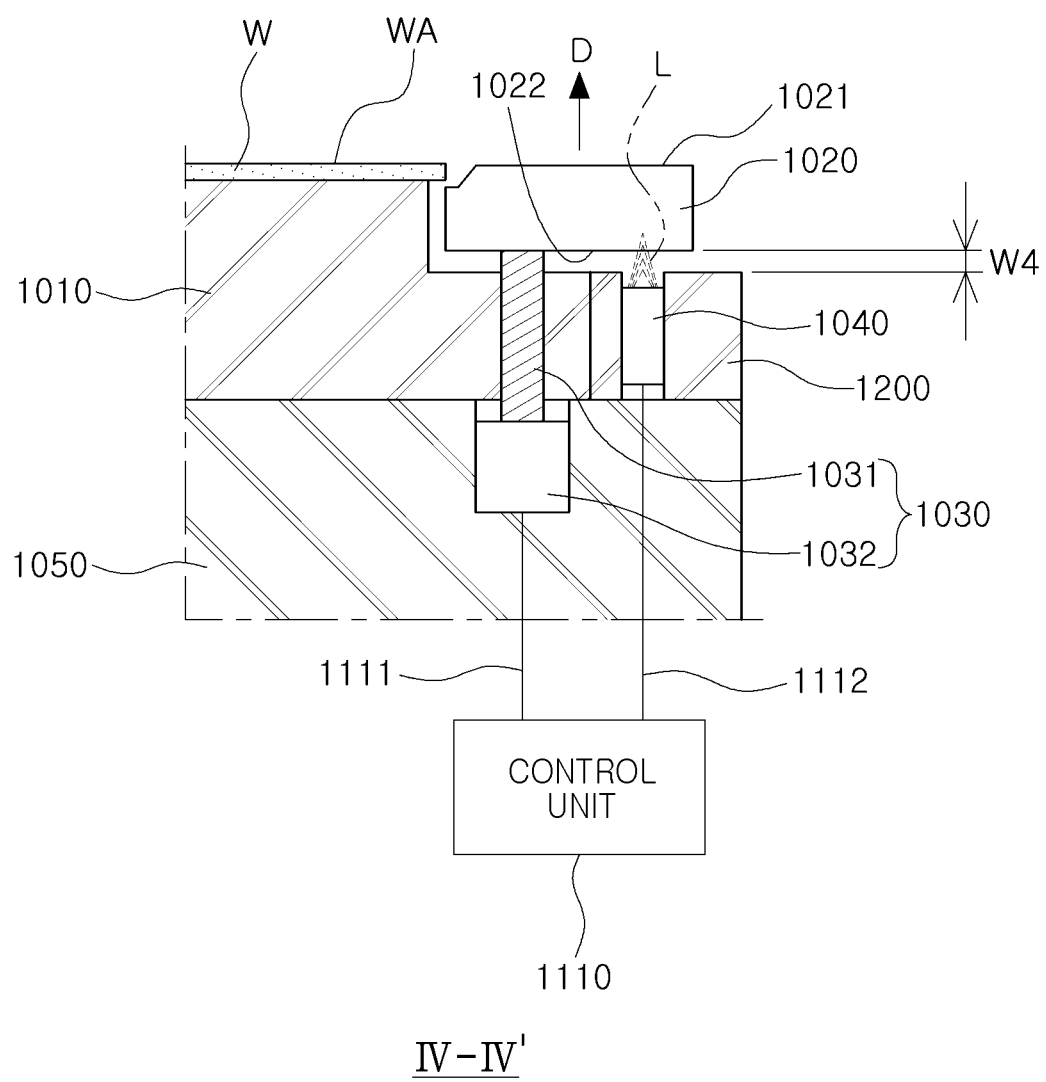
FIG. 8 is a diagram illustrating that the focus ring of FIG. 7 is raised.

A plasma processing apparatus according to an example embodiment of the present inventive concept will be described with reference to FIGS. 6 to 8. FIG. 6 is a view illustrating a plasma processing apparatus according to example embodiments, and FIG. 7 is a side cross-sectional view taken along line IV-IV' of FIG. 6. FIG. 8 is a view illustrating that the focus ring 1020 of FIG. 7 is raised. Compared with the above-described example embodiment, there is a difference in that an insulating portion 1200 is further disposed around the lower electrode 1010, and the chromatic confocal sensor 1040 is disposed in the insulating portion 1200. Other configurations are the same as those of the above-described example embodiment, and thus detailed descriptions will be omitted in order to prevent overlapping descriptions. For example, the chromatic confocal sensor 1040 may be connected to the control unit 1110 through an optical cable 1112. Driving unit 1030 may include a driving shaft 1031 for moving the focus ring 1020 up and down in the first direction while in contact with the focus ring 1020, and a driving source 1032 for driving the driving shaft 1031. The driving unit 1030 may be connected to the control unit 1110 through a cable 1111, and may be controlled by the control unit 1110.

Referring to FIG. 8, when an upper surface 1021 of the focus ring 1020 is etched, the control unit 1110 may drive the driving unit 1030 by a predetermined distance W4 in a D direction (i.e., first direction) to raise the focus ring 1020. In this case, the control unit 1110 may measure the distance to the lower surface 1022 of the focus ring 1020 through the chromatic confocal sensor 1040, and compare the distance from the lower surface 1022 of the focus ring 1020 and the distance driven by the driving unit 1030 to calculate an error value. The control unit 1110 may determine whether the calculated error value is within a preset allowable range. According to an example embodiment, when the measured error value exceeds a preset allowable range, the control unit 1110 may reduce the error value within a preset range by redriving the driving unit 1030.

Referring to FIGS. 6 and 7, in a plasma processing apparatus 2 according to an example embodiment, an insulating portion 1200 may be disposed around the lower electrode 1010.

The insulating portion 1200 may have a ring shape so as to surround and contact an outer circumferential surface of the lower electrode 1010. The insulating portion 1200 may be disposed to have a region overlapping below the focus ring 1020 in the first direction. The insulating portion 1200 may include a material, different from the focus ring 1020. More specifically, the insulating portion 1200 may include a material having etching resistance compared to the focus ring 1020 in an etching process using plasma. In addition, the insulating portion 1200 may include an insulating material. For example, when the focus ring 1020 includes silicon, the insulating portion 1200 may include quartz.

A driving unit 1030 and a chromatic confocal sensor 1040 may be disposed below the focus ring 1020, respectively. The driving unit 1030 may be disposed on the lower electrode 1010 and an isolator 1050, and the chromatic confocal sensor 1040 may be disposed on the insulating portion 1200.

Figure 9:
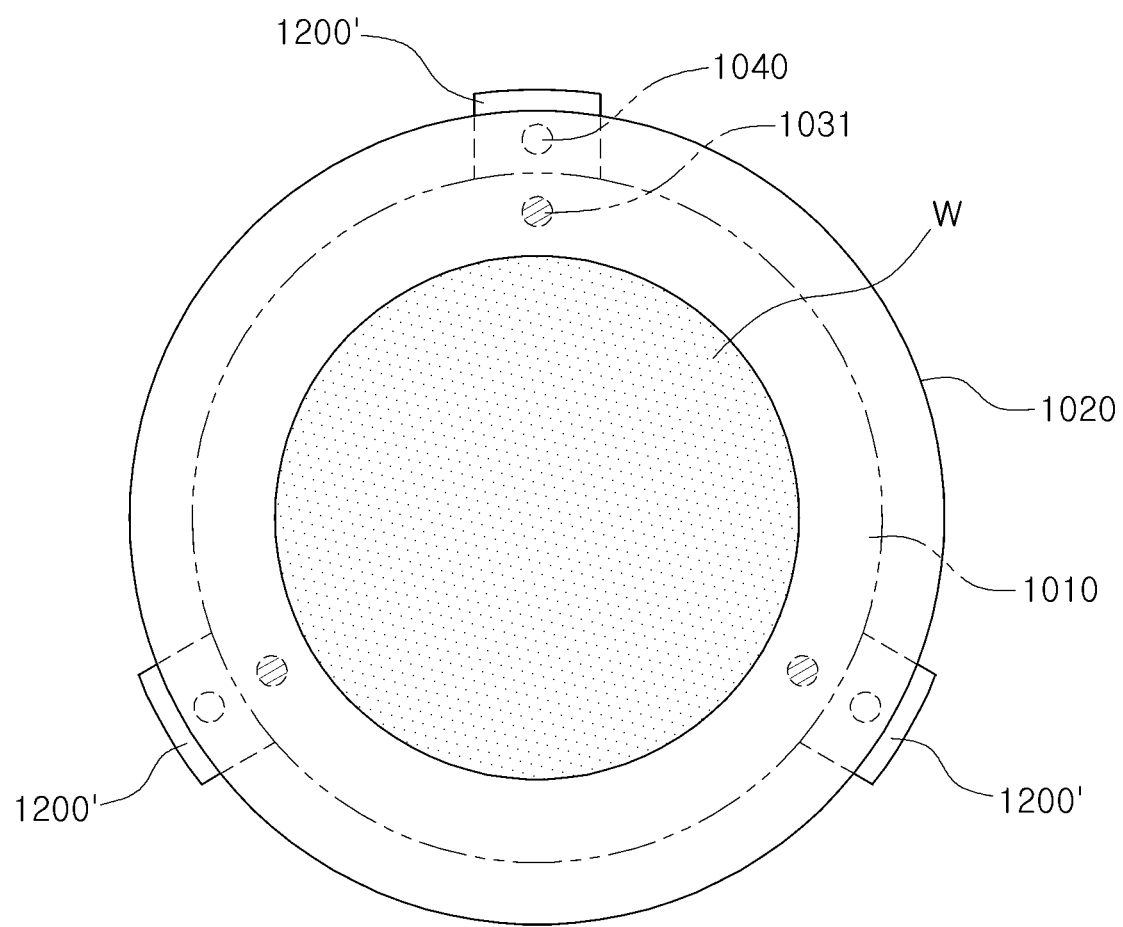

FIG. 9 is a modified example of FIG. 7, and FIG. 9 shows a case in which an insulating portion 1200' is divided into a plurality of regions instead of a ring shape. In an example embodiment, it is illustrated that the insulating portion 1200' is disposed to have the same region as the number of chromatic confocal sensors 1040, but is not limited thereto.

Figure 10:
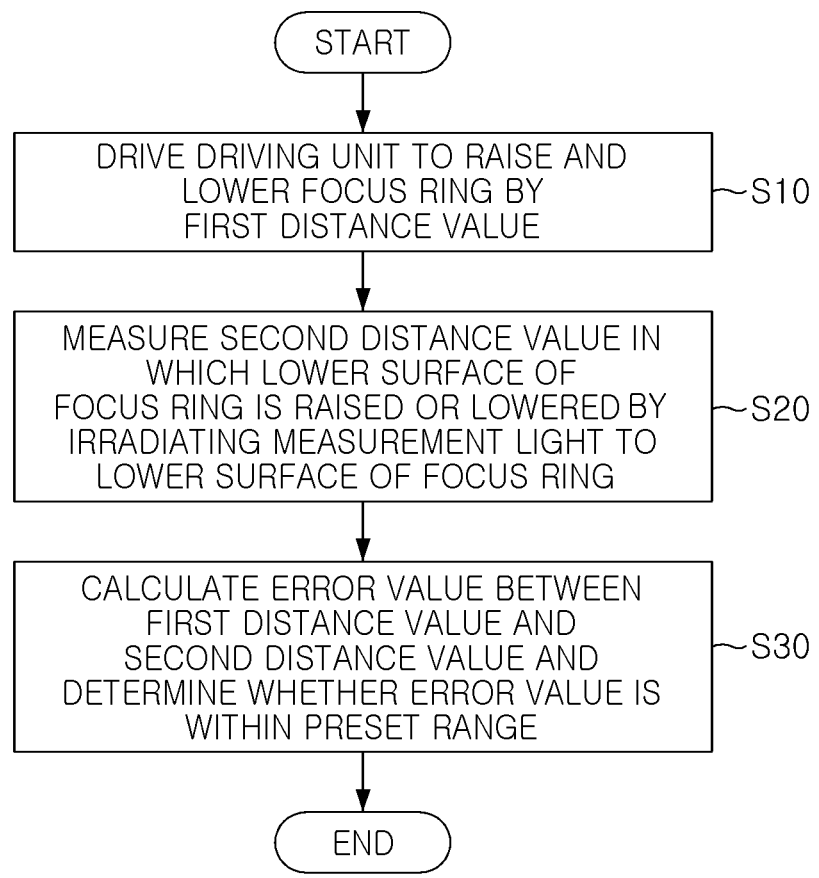
FIG. 10 is a flowchart schematically illustrating a method of manufacturing a semiconductor device according to an example embodiment of the present inventive concept.

Next, a method of manufacturing a semiconductor device according to an example embodiment will be described with reference to FIGS. 10, 1 to 3, and 5. FIG. 10 is a flowchart schematically illustrating a method of manufacturing a semiconductor device according to an example embodiment of the present inventive concept.

Referring to FIGS. 10, 1 to 3, and 5, in the plasma processing apparatus 1 including a substrate chuck, a lower electrode 10 supporting a substrate W; a focus ring 20 surrounding an outer circumferential surface of the substrate W, and driven by a driving unit 30 to be raised or lowered on the substrate chuck; a chromatic confocal sensor 40 disposed below the focus ring 20 and irradiating measurement light L to a lower surface 22 of the focus ring 20, a method of manufacturing a semiconductor device according to an example embodiment of the present inventive concept may include operations of: driving the driving unit 30 to raise and lower the focus ring 20 by a first distance value (S10); irradiating measurement light L to a lower surface 22 of the focus ring 20 to measure a second distance value in which the lower surface 22 of the focus ring 20 is raised or lowered (S20); and calculating an error value between the first distance value and the second distance value and determining whether the error value is within a preset range (S30).

As set forth above, according to an example embodiment of the present inventive concept, even if a focus ring is consumed in a plasma processing apparatus, a surface level of the focus ring may be maintained to be constant.

According to an example embodiment of the present inventive concept, in a process of manufacturing a semiconductor device, even if a focus ring is consumed, a surface level of the focus ring may be maintained to be constant.

While example embodiments have been shown and described above, it will be apparent to those skilled in the art that modifications and variations could be made without departing from the scope of the present disclosure, as defined by the appended claims.

What is claimed is:

1. A plasma processing apparatus, comprising:
 a substrate chuck extending radially in a first direction, and including a first surface and a second surface opposing the first surface, the first surface having a first region configured to support a substrate and a second region located a level lower than the first region in a second direction perpendicular to the first direction;
 an insulating portion surrounding and in direct contact with an outer circumferential surface of the second region of the substrate chuck;
 a focus ring having a first portion disposed on and in contact with the second region of the first surface of the substrate chuck and a second portion disposed on the insulating portion, the focus ring surrounding an outer circumferential surface of the first region of the substrate chuck;
 a driving unit disposed below the first portion of the focus ring, the driving unit including a driving source and including a driving shaft extending through a first through hole provided in the second region of the substrate chuck and in direct contact with a lower surface of the focus ring, the driving unit configured to adjust a position of an upper surface of the focus ring by raising or lowering the focus ring by a first distance value in the second direction;
 a chromatic confocal sensor including
  a body portion having an internal space,
  a light source portion disposed in the internal space and emitting white light,
  an optical module portion disposed in front of the light source portion and configured to disperse the white light into measurement light composed of a plurality of monochromatic lights, and
  a light transmitting cover portion disposed in front of the optical module portion and sealing the body portion,
 the chromatic confocal sensor disposed below the second portion of the focus ring and within the insulating portion, the chromatic confocal sensor configured to measure, a second distance value in which the lower surface of the focus ring is moved in the second direction, by irradiating the measurement light to the lower surface of the focus ring through a second through hole provided below the focus ring, and configured to detect a thickness value of the light transmitting cover portion; and
 a control unit configured to
  calculate a third distance value between the first surface and the lower surface of the focus ring by subtracting the thickness value of the light transmitting cover portion and a distance value between an upper surface of the chromatic confocal sensor and the first surface from the second distance value, and
  calculate an error value between the first distance value and the third distance value and determining whether the error value is within a preset range.

2. The plasma processing apparatus of claim 1, wherein the body portion is made of at least one of aluminum alloy, $Al_2O_3$, AlN, SiC, and quartz.

3. The plasma processing apparatus of claim 1, further comprising:
 a plurality of chromatic confocal sensors,
 wherein when viewed from the first surface, the plurality of chromatic confocal sensors are disposed on an outer circumferential surface of the second region of the substrate chuck to have an equal angle therebetween with respect to a center of the substrate chuck.

4. The plasma processing apparatus of claim 1, further comprising:
 a plurality of chromatic confocal sensors,
 wherein when viewed from the first surface, the plurality of chromatic confocal sensors are disposed in the insulating portion to have an equal angle with respect to the center of the substrate.

5. The plasma processing apparatus of claim 4, wherein the plurality of chromatic confocal sensors comprise at least three chromatic confocal sensors.

6. The plasma processing apparatus of claim 4, wherein the driving unit is a plurality of driving units, and wherein the plurality of driving units are respectively disposed to be adjacent to the plurality of chromatic confocal sensors.

7. A plasma processing apparatus, comprising:
a chamber having an internal space for processing a substrate by generating plasma;
a substrate chuck extending radially in a first direction and disposed in the internal space, the substrate chuck including a first surface and a second surface opposing the first surface, the first surface having a first region configured to support the substrate and a second region located a level lower than the first region in a second direction perpendicular to the first direction;
an insulating portion surrounding and in direct contact with an outer circumferential surface of the second region of the substrate chuck;
a focus ring having a first portion disposed on and in contact with the second region of the first surface of the substrate chuck and a second portion disposed on the insulating portion, the focus ring surrounding an outer circumferential surface of the first region of the substrate chuck, the focus ring configured to be detachable from the substrate chuck;
a driving unit disposed below the first portion of the focus ring, the driving unit including a driving source and including a driving shaft extending through a first through hole provided in the second region of the substrate chuck and in direct contact with a lower surface of the focus ring, the driving unit configured to adjust a position of an upper surface of the focus ring by raising or lowering the focus ring by a first distance value in the second direction;
a chromatic confocal sensor including
a body portion having an internal space,
a light source portion disposed in the internal space and emitting white light,
an optical module portion disposed in front of the light source portion and configured to disperse the white light into measurement light composed of a plurality of monochromatic lights, and
a light transmitting cover portion disposed in front of the optical module portion and sealing the body portion,
the chromatic confocal sensor disposed below the second portion of the focus ring and within the insulating portion, the chromatic confocal sensor configured to measure a second distance value at which a lower surface of the focus ring is raised or lowered in the second direction by irradiating the measurement light to the lower surface of the focus ring through a second through hole provided below the focus ring, and configured to detect a thickness value of the light transmitting cover portion; and
a control unit configured to
calculate a third distance value between the first surface and the lower surface of the focus ring by subtracting a distance value between an upper surface of the chromatic confocal sensor and the first surface and the thickness value of the light transmitting cover portion from the second distance value, and
calculate an error value between the first distance value and the third distance value and determining whether the error value is within a preset range.

8. The plasma processing apparatus of claim 7, wherein the control unit further comprises a photodetector for detecting a spectrum of reflected light in which the measurement light is reflected from the lower surface of the focus ring,
wherein the control unit calculates the second distance value based on the spectrum.

9. The plasma processing apparatus of claim 7, wherein the chamber is a chamber for performing an etching process.

10. The plasma processing apparatus of claim 7, wherein when the error value is outside a preset range, the control unit redrives the driving unit to reduce the error value within a preset range.

* * * * *